(12) United States Patent
Sano

(10) Patent No.: US 9,475,284 B2
(45) Date of Patent: Oct. 25, 2016

(54) LIQUID DISCHARGING APPARATUS, HEAD UNIT, CAPACITIVE LOAD DRIVING CIRCUIT, AND CONTROL METHOD OF CAPACITIVE LOAD DRIVING CIRCUIT

(71) Applicant: Seiko Epson Corporation, Tokyo (JP)

(72) Inventor: Takafumi Sano, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/003,165

(22) Filed: Jan. 21, 2016

(65) Prior Publication Data

US 2016/0221332 A1 Aug. 4, 2016

(30) Foreign Application Priority Data

Feb. 4, 2015 (JP) ................................. 2015-020481

(51) Int. Cl.
*B41J 2/045* (2006.01)
*H03F 3/217* (2006.01)

(52) U.S. Cl.
CPC ......... *B41J 2/04541* (2013.01); *B41J 2/04581* (2013.01); *H03F 3/217* (2013.01)

(58) Field of Classification Search
USPC ......................................................... 330/10
See application file for complete search history.

(56) References Cited

U.S. PATENT DOCUMENTS

| | | | | |
|---|---|---|---|---|
| 6,118,336 A | * | 9/2000 | Pullen | H03F 1/305 330/10 |
| 2005/0168206 A1 | * | 8/2005 | Nadd | H02M 1/08 323/285 |
| 2005/0231179 A1 | | 10/2005 | Ishizaki | |
| 2010/0231297 A1 | * | 9/2010 | Buitendijk | H03F 1/26 330/251 |
| 2015/0062207 A1 | * | 3/2015 | Abe | B41J 2/04541 347/5 |

FOREIGN PATENT DOCUMENTS

| | | |
|---|---|---|
| JP | 2005-329710 A | 12/2005 |
| JP | 2010-114711 A | 5/2010 |

\* cited by examiner

*Primary Examiner* — Shelby Fidler
(74) *Attorney, Agent, or Firm* — Harness, Dickey & Pierce, P.L.C.

(57) ABSTRACT

A liquid discharging apparatus includes a modulation portion that generates a modulation signal obtained by pulse-modulating a source signal; an amplifier that includes a first transistor and a second transistor operating based on the modulation signal; an operation control portion that controls operations of the amplifier; a low-pass filter that generates a driving signal by demodulating an amplification modulation signal generated based on operations of the first transistor and the second transistor; and a piezoelectric element that is displaced by applying the driving signal. The operation control portion performs a stopping process that stops an operation of the amplifier by allowing the first transistor to be in a non-conductive state in which a current does not flow through the first transistor and the second transistor to be in a conductive state in which the current flows through the second transistor.

9 Claims, 10 Drawing Sheets

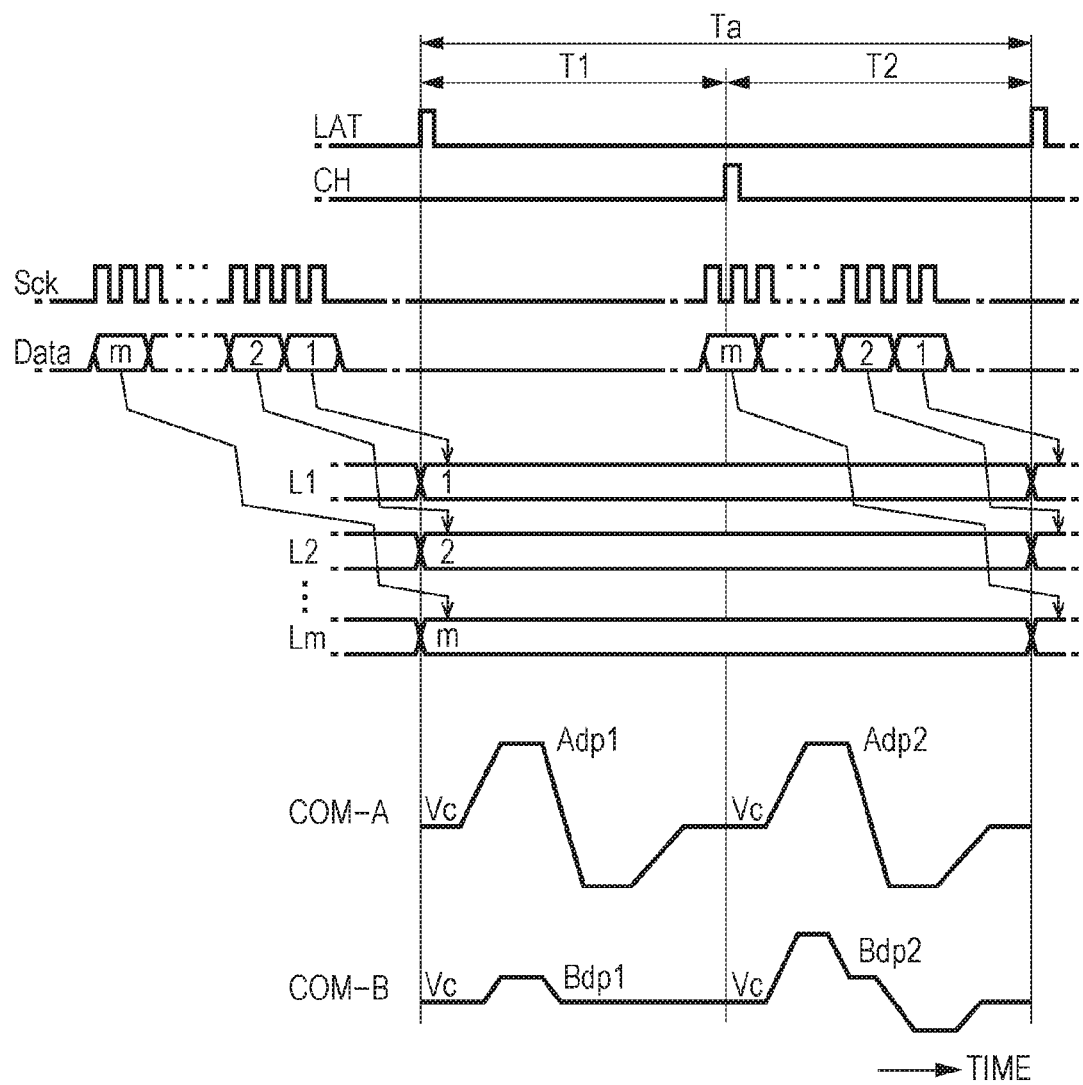

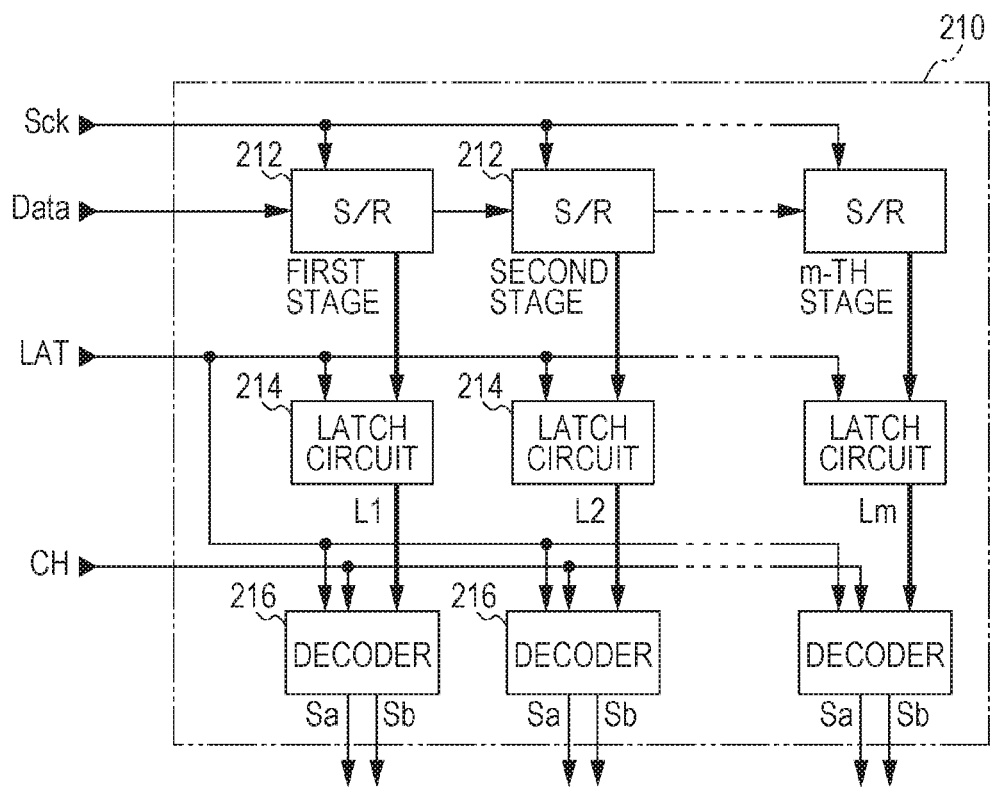

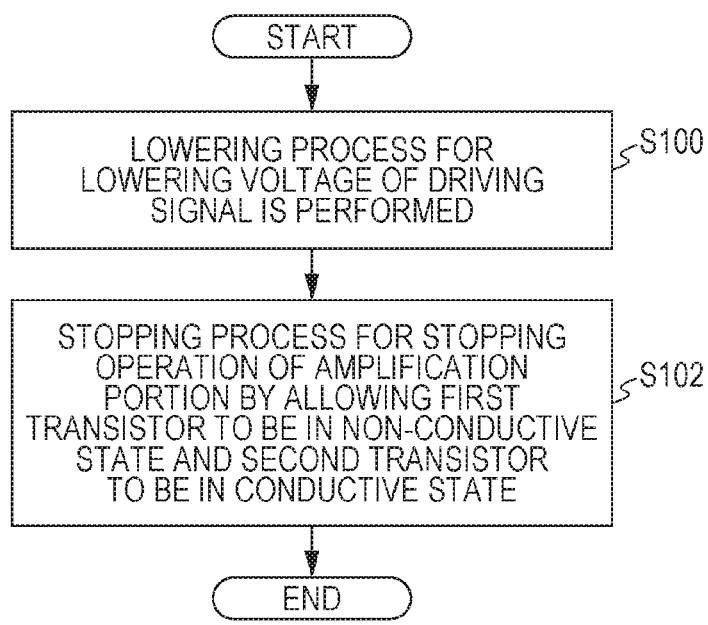

LIQUID DISCHARGING APPARATUS, HEAD UNIT, CAPACITIVE LOAD DRIVING CIRCUIT, AND CONTROL METHOD OF CAPACITIVE LOAD DRIVING CIRCUIT

The entire disclosure of Japanese Patent Application No. 2015-020481, filed Feb. 4, 2015 is expressly incorporated by reference herein.

BACKGROUND

1. Technical Field

The present invention relates to a liquid discharging apparatus, a head unit, a capacitive load driving circuit, and a control method of a capacitive load driving circuit.

2. Related Art

In a liquid discharging apparatus, such as an ink jet printer, which discharges ink and prints an image or a document, an apparatus which uses a piezoelectric element (for example, a piezo element) is known. The piezoelectric elements are provided corresponding to each of a plurality of nozzles in a head unit, and each of the piezoelectric elements is driven in accordance with driving signals. Accordingly, a predetermined amount of ink (liquid) is discharged from the nozzle at a predetermined timing, and a dot is formed. Since the piezoelectric element is a capacitive load, such as a capacitor, in terms of electricity, it is necessary to supply sufficient amount of current in order to operate the piezoelectric elements of each nozzle.

For this reason, in the above-described liquid discharging apparatus, the piezoelectric elements are driven as a driving signal which is amplified by an amplifying circuit is supplied to a head unit (ink jet head). An example of the amplifying circuit includes a type which performs current amplification with respect to a source signal before the amplification by using a class-AB amplifier, but since energy efficiency is not excellent, in recent years, a type in which a class-D amplifier is used has been suggested (refer to JP-A-2010-114711 and JPA-2005-329710).

Here, the invention of JP-A-2005-329710 includes a bootstrap circuit configured of a diode D0 and a capacitor C0. Then, in a class-D amplification path, an analog driving signal is demodulated by providing a low-pass filter (LPF) for returning to an original analog driving signal after power amplification. The LPF is, for example, configured of a coil and a capacitor, and drives an actuator configured of a capacitive load. Thus, a potential of a signal input portion of the LPF before start of an operation of a gate driver is equal to a high potential supplied to the gate driver. That is, the potential of the signal input portion of the LPF is not a ground potential before the start of the operation of the gate driver as in a case of driving a resistive load.

Then, when the operation of the gate driver is started, a current sharply flows through a transistor (for example, corresponding to a transistor Q25 of FIG. 2 in JP-A-2005-329710) on a grounded side (hereinafter, low-side). Then, when the potential of the input portion of the LPF becomes the ground potential, a sharp current flows through the diode D0 to charge the capacitor C0 of the bootstrap circuit. In this case, when a current of more than rated current flows, there is a concern that the transistor Q25 and the diode D0 on the low-side are deteriorated.

SUMMARY

An advantage of some aspects of the invention is to provide a liquid discharging apparatus, a head unit, a capacitive load driving circuit, and a control method of a capacitive load driving circuit, in which it is possible to prevent an over-current from flowing through a circuit element at a start of an operation and reliability is high.

The invention can be realized in the following aspects or application examples.

Application Example 1

According to this application example, there is provided a liquid discharging apparatus including: a modulation portion that generates a modulation signal obtained by pulse-modulating a source signal; an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element; an operation control portion that controls operations of the amplifier; a low-pass filter that generates a driving signal by demodulating an amplification modulation signal generated based on operations of the first transistor and the second transistor; a piezoelectric element that is displaced by applying the driving signal; a cavity of which an inside is filled with a liquid and an internal volume is changed by displacement of the piezoelectric element; and a nozzle that communicates with the cavity and discharges the liquid on the inside of the cavity as liquid droplets in accordance with the change in the internal volume of the cavity. The operation control portion performs a stopping process that stops an operation of the amplifier by allowing the first transistor to be in a non-conductive state in which a current does not flow through the first transistor and the second transistor to be in a conductive state in which the current flows through the second transistor.

In this case, one end of the capacitive element becomes a low potential by allowing the first transistor to be in the non-conductive state and allowing the second transistor to be in the conductive state. Thus, it is possible to charge the capacitive element via the rectifying element when the stopping process is performed. Therefore, it is possible to prevent an over-current from flowing through circuit elements (rectifying element and the second transistor) when starting the operation and thereby it is possible to realize the liquid discharging apparatus having high reliability.

Application Example 2

In the liquid discharging apparatus according to the application example, the operation control portion may perform the stopping process after a lowering process for lowering a voltage of the driving signal.

In this case, if the second transistor is in the conductive state, it is possible to decrease the resonance amplitude even if a resonant loop is formed via the second transistor, the low-pass filter, and a ground line. Thus, it is possible to prevent the over-current from flowing through the second transistor and thereby it is possible to realize the liquid discharging apparatus having high reliability.

Application Example 3

In the liquid discharging apparatus according to the application example, the operation control portion may perform control of the voltage of the driving signal to be the lowest value of an output range of the driving signal corresponding to an input range of the source signal in the lowering process.

In this case, also in the lowering process, since the driving signal is continuously generated based on the source signal, it is possible to reduce a possibility that an oscillation loop is formed via a resistance component of the second transistor, the low-pass filter, and the ground line. Thus, it is possible to prevent an over-current from flowing through the second transistor and thereby it is possible to realize the liquid discharging apparatus having high reliability.

Application Example 4

In the liquid discharging apparatus according to the application example, the liquid discharging apparatus may further include a source signal generating portion that generates the source signal, and a feedback circuit that generates a feedback signal based on the driving signal and sends back the feedback signal to the modulation portion. The operation control portion may control the driving signal by controlling an output of the source signal generating portion to be the lowest value or a maximum value in the lowering process.

In this case, also in the lowering process, since the driving signal is continuously generated based on the source signal, it is possible to reduce a possibility that an oscillation loop is formed via the resistance component of the second transistor, the low-pass filter, and the ground line. Thus, it is possible to prevent an over-current from flowing through the second transistor and thereby it is possible to realize the liquid discharging apparatus having high reliability.

Application Example 5

In the liquid discharging apparatus according to the application example, the operation control portion may perform a pausing process that pauses the operation of the amplifier by allowing the first transistor and the second transistor to be in the non-conductive state in which the current does not flow therethrough if the voltage of the driving signal is constant.

In this case, since the piezoelectric element has a nature of holding the voltage, it is possible to reduce power consumption in the amplifier and the low-pass filter by performing the pausing process if the voltage of the driving signal is constant.

Application Example 6

In the liquid discharging apparatus according to the application example, an oscillation frequency of the modulation signal may be equal to or greater than 1 MHz and equal to or less than 8 MHz.

In this case, the driving signal is generated by smoothing the amplification modulation signal, the piezoelectric element is displaced as the driving signal is applied, and liquid is discharged from the nozzle. Here, for example, when the liquid discharging apparatus performs frequency spectrum analysis with respect to a waveform of the driving signal for discharging small dots, it is confirmed that a frequency component which is equal to or greater than 50 kHz is included. In order to generate the driving signal which includes the frequency component which is equal to or greater than 50 kHz, the frequency of the modulation signal (frequency of self-excited oscillation) is required to be equal to or greater than 1 MHz.

If the frequency is lower than 1 MHz, an edge of the waveform of a reproduced driving signal becomes blunt and round. In other words, an angle is rounded and the waveform becomes blunt. When the waveform of the driving signal is blunt, the displacement of the piezoelectric element which is operated in accordance with a rising or falling edge of the waveform becomes slow, tailing during discharge or a discharge defect is generated, and quality of printing deteriorates.

Meanwhile, if the frequency of the self-excited oscillation is greater than 8 MHz, resolution of the waveform of the driving signal increases. However, as a switching frequency increases in the transistor, switching loss increases, and compared to linear amplification of a class-AB amplifier or the like, excellent power saving performance and generated heat saving performance are deteriorated.

For this reason, in the above-described liquid discharging apparatus, it is preferable that the frequency of the modulation signal is equal to or greater than 1 MHz and equal to or less than 8 MHz.

Application Example 7

According to this application example, there is provided a head unit including: a modulation portion that generates a modulation signal obtained by pulse-modulating a source signal; an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element; an operation control portion that controls operations of the amplifier; a low-pass filter that generates a driving signal by demodulating an amplification modulation signal generated based on operations of the first transistor and the second transistor; a piezoelectric element that is displaced by applying the driving signal; a cavity of which an inside is filled with a liquid and an internal volume is changed by displacement of the piezoelectric element; and a nozzle that communicates with the cavity and discharges the liquid on the inside of the cavity as liquid droplets in accordance with the change in the internal volume of the cavity. The operation control portion performs a stopping process that stops an operation of the amplifier by allowing the first transistor to be in a non-conductive state in which a current does not flow through the first transistor and the second transistor to be in a conductive state in which the current flows through the second transistor.

In this case, one end of the capacitive element becomes a low potential by allowing the first transistor to be in the non-conductive state and allowing the second transistor to be in the conductive state. Thus, it is possible to charge the capacitive element via the rectifying element when the stopping process is performed. Therefore, it is possible to prevent an over-current from flowing through circuit elements (rectifying element and the second transistor) when starting the operation and thereby it is possible to realize the head unit having high reliability.

Application Example 8

According to this application example, there is provided a capacitive load driving circuit including: a modulation portion that generates a modulation signal obtained by pulse-modulating a source signal; an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element; an operation control portion that controls operations of the amplifier; and a low-pass filter that generates a driving signal by demodulating an amplification modulation signal generated based on operations of the first transistor and the second transistor, and outputs the driving signal to a capacitive load. The operation control portion performs a stopping process that stops an operation of the amplifier by allowing the first transistor to be in a non-conductive state in which a current does not flow through the first transistor and the second transistor to be in a conductive state in which the current flows through the second transistor.

In this case, one end of the capacitive element becomes a low potential by allowing the first transistor to be in the non-conductive state and allowing the second transistor to be in the conductive state. Thus, it is possible to charge the capacitive element via the rectifying element when the stopping process is performed. Therefore, it is possible to prevent an over-current from flowing through circuit elements (rectifying element and the second transistor) when starting the operation and thereby it is possible to realize the capacitive load driving circuit having high reliability.

Application Example 9

According to this application example, there is provided a control method of a capacitive load driving circuit, the capacitive load driving circuit including a modulation portion that generates a modulation signal obtained by pulse-modulating a source signal; an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element; and a low-pass filter that generates a driving signal by demodulating an amplification modulation signal generated based on operations of the first transistor and the second transistor and outputs the driving signal to a capacitive load, the method including: performing a lowering process for lowering a voltage of the driving signal; and performing a stopping process for stopping an operation of the amplifier by allowing the first transistor to be in a non-conductive state in which the current does not flow through the first transistor and the second transistor to be in a conductive state in which the current flows through the second transistor.

In this case, one end of the capacitive element becomes a low potential by allowing the first transistor to be in the non-conductive state and allowing the second transistor to be in the conductive state. Thus, it is possible to charge the capacitive element via the rectifying element when the stopping process is performed. Therefore, it is possible to prevent an over-current from flowing through circuit elements (rectifying element and the second transistor) when starting the operation and thereby it is possible to realize the control method of the capacitive load driving circuit having high reliability.

BRIEF DESCRIPTION OF THE DRAWINGS

The invention will be described with reference to the accompanying drawings, wherein like numbers reference like elements.

FIG. 5 is a view illustrating an operation of a selection control portion in the head unit.

FIG. 6 is a view illustrating a configuration of the selection control portion in the head unit.

FIG. 7 is a view illustrating decoding contents of a decoder in the head unit.

FIG. 13 is a flowchart illustrating a control method of the capacitive load driving circuit according to the embodiment.

DESCRIPTION OF EXEMPLARY EMBODIMENTS

Hereinafter, an appropriate embodiment of the invention will be described in detail by using the drawings. The drawings used are for convenience of the description. In addition, the embodiment which will be described hereinafter does not inappropriately limit the contents of the invention described within the range of the patent claims. All of the configurations which will be described hereinafter are not necessarily essential configuration requirements of the invention.

1. Outline of Liquid Discharging Apparatus

A printing apparatus which is an example of a liquid discharging apparatus according to the embodiment is an ink jet printer which forms an ink dot group on a printing medium, such as a paper sheet by discharging ink in accordance with image data supplied from an external host computer, and accordingly, prints an image (including characters or figures) which corresponds to the image data.

Examples of the liquid discharging apparatus include a printing apparatus, such as a printer, a color material discharging apparatus which is used in manufacturing a color filter, such as a liquid crystal display, an electrode material discharging apparatus which is used in forming an electrode, such as an organic EL display or a field emission display (FED), and a bio organic material discharging apparatus which is used in manufacturing a bio chip.

Figure 1:
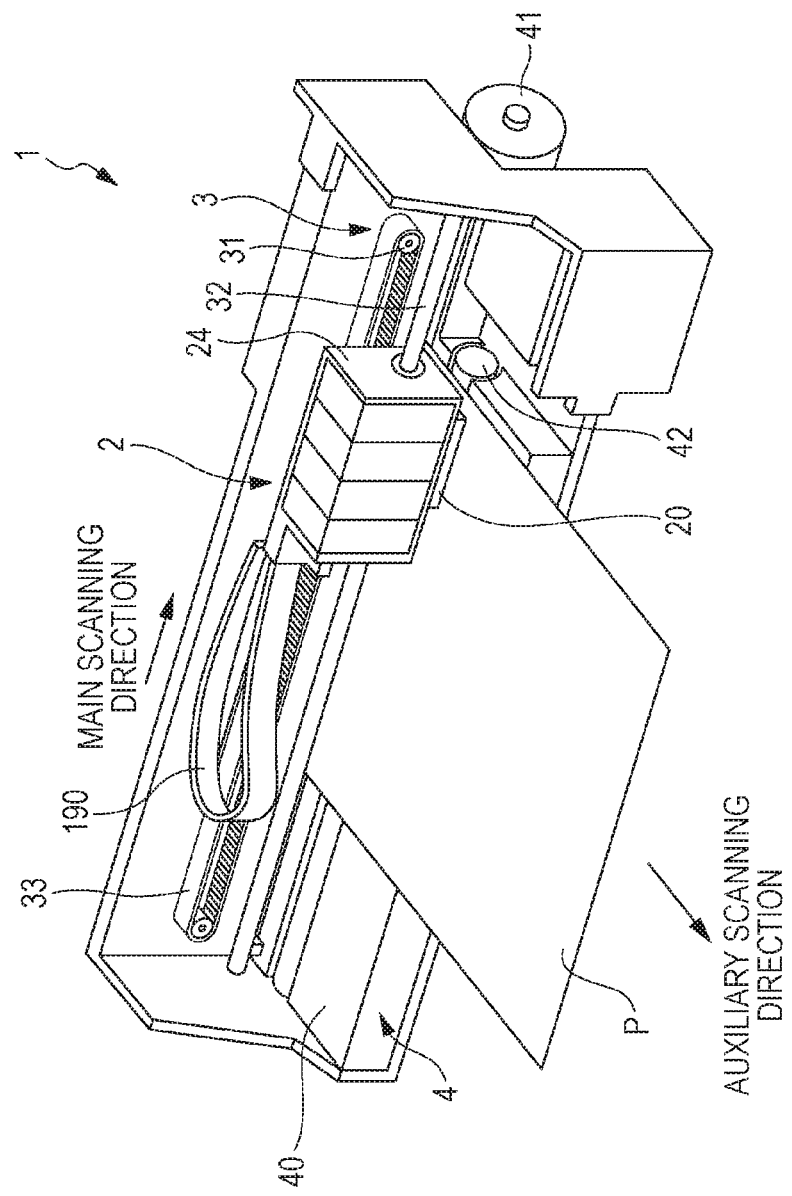
FIG. 1 is a view illustrating a schematic configuration of a liquid discharging apparatus.

FIG. 1 is a perspective view illustrating a schematic configuration of an inside of a liquid discharging apparatus 1. As illustrated in FIG. 1, the liquid discharging apparatus 1 includes a moving mechanism 3 which makes a moving object 2 move (reciprocate) in a main scanning direction.

The moving mechanism 3 includes a carriage motor 31 which is a driving source of the moving object 2, a carriage guide shaft 32 of which both ends are fixed, and a timing belt 33 which extends substantially parallel to the carriage guide shaft 32 and is driven by the carriage motor 31.

A carriage 24 of the moving object 2 is supported to freely reciprocate by the carriage guide shaft 32 and fixed to a part of the timing belt 33. For this reason, when the carriage motor 31 makes the timing belt 33 normally/reversely travel, the moving object 2 is guided to the carriage guide shaft 32 and reciprocates.

In addition, in the moving object 2, a head unit 20 is provided at a part that opposes a printing medium P. As will be described later, the head unit 20 is for discharging ink droplets (liquid droplets) from multiple nozzles, and various types of control signals are supplied thereto via a flexible cable 190.

The liquid discharging apparatus 1 includes a transporting mechanism 4 which transports the printing medium P on a platen 40 in an auxiliary scanning direction. The transporting mechanism 4 includes a transporting motor 41 which is a driving source, and a transporting roller 42 which rotates by the transporting motor 41 and transports the printing medium P in the auxiliary scanning direction.

At a timing when the printing medium P is transported by the transporting mechanism 4, as the head unit 20 discharges the ink droplets onto the printing medium P, an image is formed on a front surface of the printing medium P.

Figure 2:
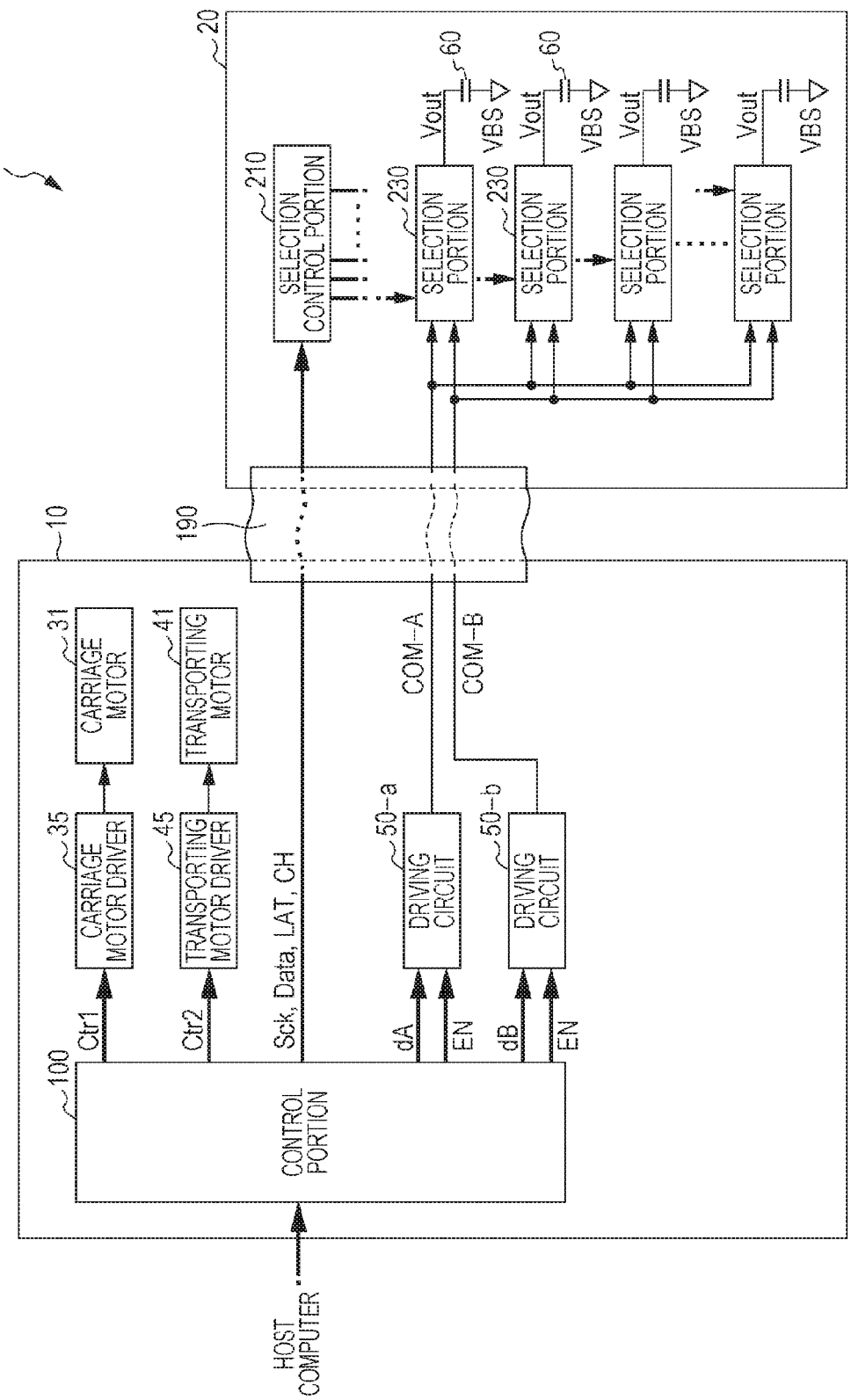
FIG. 2 is a block diagram illustrating a configuration of the liquid discharging apparatus.

FIG. 2 is a block diagram illustrating an electrical configuration of the liquid discharging apparatus 1.

As illustrated in FIG. 2, in the liquid discharging apparatus 1, a control unit 10 and the head unit 20 are connected to each other via the flexible cable 190.

The control unit 10 includes a control portion 100, the carriage motor 31, a carriage motor driver 35, the transporting motor 41, a transporting motor driver 45, a driving circuit 50-$a$, and a driving circuit 50-$b$. Among these, the control portion 100 outputs various types of control signals for controlling each portion when the image data is supplied from the host computer.

Specifically, firstly, the control portion 100 supplies a control signal Ctr1 to the carriage motor driver and the carriage motor driver 35 drives the carriage motor 31 in accordance with the control signal Ctr1. Accordingly, the movement in the main scanning direction in the carriage 24 is controlled.

Secondly, the control portion 100 supplies a control signal Ctr2 to the transporting motor driver 45 and the transporting motor driver 45 drives the transporting motor 41 in accordance with the control signal Ctr2. Accordingly, the movement in the auxiliary scanning direction by the transporting mechanism 4 is controlled.

Thirdly, the control portion 100 supplies digital data dA to one driving circuit 50-$a$ and supplies digital data dB to the other driving circuit 50-$b$, among the two driving circuits 50-$a$ and 50-$b$. Here, the data dA regulates a waveform of a driving signal COM-A and the data dB regulates a waveform of a driving signal COM-B, among driving signals supplied to the head unit 20.

Fourthly, the control portion 100 outputs an enable signal EN instructing whether or not two driving circuits 50-$a$ and 50-$b$ are operated.

In addition, as will be described in detail later, the driving circuit 50-$a$ supplies the driving signal COM-A amplified by a class-D amplifier to the head unit 20 after the data dA is analog-converted. Similarly, the driving circuit 50-$b$ supplies the driving signal COM-B amplified by the class-D amplifier to the head unit 20 after the data dB is analog-converted. In addition, in the driving circuits 50-$a$ and 50-$b$, only the data to be input and the driving signal to be output are different, and the configuration from the viewpoint of the circuit is the same as will be described later. For this reason, when it is not necessary to specify the driving circuits 50-$a$ and 50-$b$ (for example, when describing FIG. 10 later), the reference numeral after "-" will be omitted, and simply "50" will be used in the description.

Fifthly, the control portion 100 supplies a clock signal Sck, a data signal Data, and control signals LAT and CH to the head unit 20.

In the head unit 20, a plurality of groups including a selection control portion 210, a selection portion 230, and a piezoelectric element (piezo element) 60, are provided. In addition, as will be described later, the head unit 20 may include the driving circuits 50-$a$ and 50-$b$.

The selection control portion 210 instructs each of the selection portions 230 to select or to not select any of the driving signals COM-A and COM-B (or to select none of the signals) by the control signal or the like supplied from the control portion 100. The selection portion 230 is configured to include a transistor and selects whether or not the driving signal is applied to the piezoelectric element 60. The selection portion 230 selects the driving signals COM-A and COM-B in accordance with the instruction of the selection control portion 210 and supplies the driving signals COM-A and COM-B as the driving signal to each of one ends of the piezoelectric elements 60. In addition, in FIG. 2, a voltage of the driving signal is expressed as Vout. A voltage VBS is commonly applied to each of the other ends of the piezoelectric elements 60.

The piezoelectric element 60 is displaced as the driving signal is applied. The piezoelectric elements 60 are provided corresponding to each of a plurality of nozzles in the head unit 20. In addition, the piezoelectric elements 60 are displaced in accordance with a difference between the voltage Vout and the voltage VBS of the driving signal selected by the selection portion 230, and discharge the ink. Next, a configuration for discharging the ink by the driving of the piezoelectric element 60 will be simply described.

Figure 3:
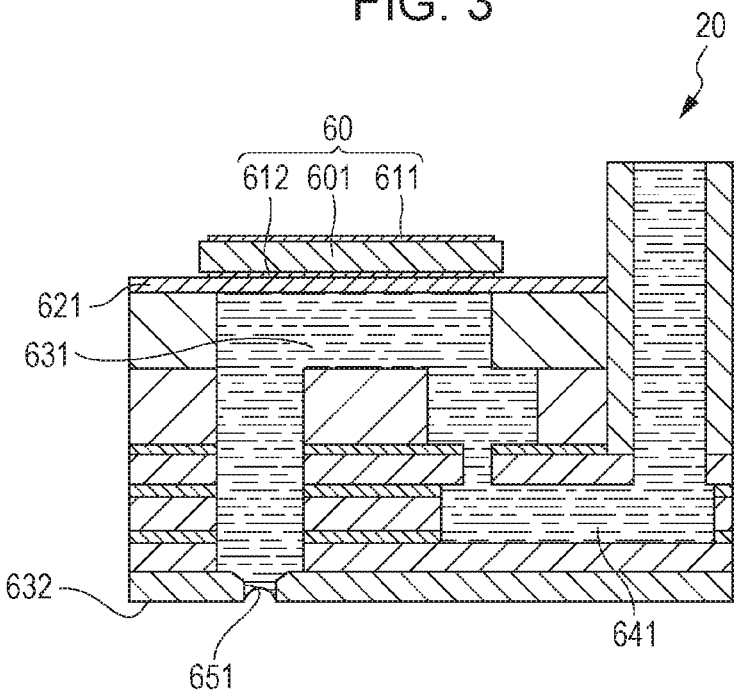
FIG. 3 is a view illustrating a configuration of a discharging portion in a head unit.

FIG. 3 is a view illustrating a schematic configuration which corresponds to one nozzle, in the head unit 20.

As illustrated in FIG. 3, the head unit 20 includes the piezoelectric element 60, a diaphragm 621, a cavity (pressure chamber) 631, a reservoir 641, and a nozzle 651. Among these, the diaphragm 621 functions as a diaphragm which is displaced (bending vibration) by the piezoelectric element 60 provided on an upper surface in the drawing, and enlarges/reduces the internal volume of the cavity 631 which is filled with the ink. The nozzle 651 is an opening portion which is provided on a nozzle plate 632 and communicates with the cavity 631. The cavity 631 is filled with the liquid (for example, the ink), and the internal volume thereof changes by the displacement of the piezoelectric element 60. The nozzle 651 communicates with the cavity 631 and discharges the liquid inside the cavity 631 as the liquid droplets in accordance with the change in the internal volume of the cavity 631.

The piezoelectric element 60 illustrated in FIG. 3 has a structure in which a piezoelectric body 601 is nipped by one pair of electrodes 611 and 612. In a case of the piezoelectric body 601 having such a structure, in accordance with the voltage applied by the electrodes 611 and 612, a center part in FIG. 3 bends in a vertical direction with respect to both end parts together with the electrodes 611 and 612, and the diaphragm 621. Specifically, when the voltage Vout of the driving signal increases, the piezoelectric element 60 bends upwardly, and when the voltage Vout decreases, the piezoelectric element 60 bends downwardly. In this configuration, the ink is drawn out of the reservoir 641 when the piezoelectric element 60 bends upwardly since the internal volume of the cavity 631 is enlarged. Meanwhile, when the piezoelectric element 60 bends downwardly, the internal volume of the cavity 631 is reduced, and thus, the ink is discharged from the nozzle 651 according to the level of the reduction of the volume.

In addition, the piezoelectric element 60 is not limited to the illustrated structure, and may be a type which can discharge the liquid, such as the ink, by deforming the piezoelectric element 60. In addition, the piezoelectric element 60 may be configured to use so-called longitudinal vibration, not being limited to the bending vibration.

In addition, the piezoelectric element 60 is provided corresponding to the cavity 631 and the nozzle 651 in the head unit 20, and the piezoelectric element 60 is provided corresponding to the selection portion 230 in FIG. 1. For this reason, a set of the piezoelectric element 60, the cavity 631, the nozzle 651, and the selection portion 230 is provided in every nozzle 651.

Figure 4A:
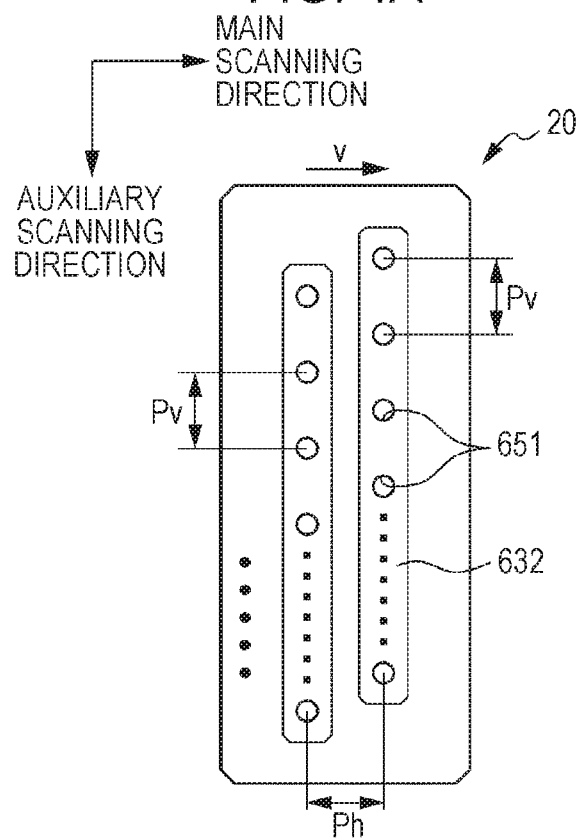
FIGS. 4A and 4B are views illustrating a nozzle arrangement in the head unit.

FIG. 4A is a view illustrating an example of arrangement of the nozzles 651.

As illustrated in FIG. 4A, the nozzles 651 are arranged as follows in two rows, for example. Specifically, while the plurality of nozzles 651 are disposed at a pitch Pv along the auxiliary scanning direction when only one row is viewed, the nozzles 651 have a relationship of being separated by a pitch Ph in the main scanning direction and being shifted only by half of the pitch Pv in the auxiliary scanning direction between the two rows.

In addition, in the nozzles 651, when color printing is performed, patterns which correspond to each color, such as cyan (C), magenta (M), yellow (Y), and black (K), are provided along the main scanning direction, for example. However, in the following description, for simplification, a case where gradation is expressed in a single color will be described.

Figure 4B:
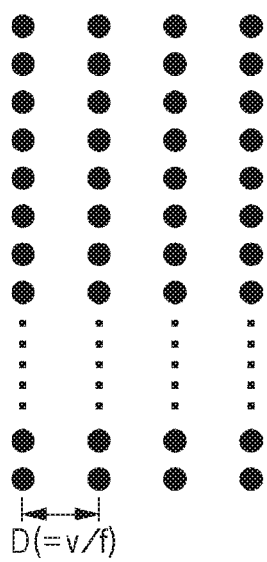

FIG. 4B is a view illustrating a basic resolution of image forming according to the nozzle arrangement illustrated in FIG. 4A. In addition, FIG. 4B is for simplifying the description, and is an example of a method (first method) for forming one dot by discharging the ink droplet one time from the nozzle 651. Black circles illustrate the dots formed as the ink droplets land.

When the head unit 20 moves at a speed v in the main scanning direction, as illustrated in FIG. 4B, an interval D (in the main scanning direction) between the dots, formed by the landing of the ink droplets, and the speed v have the following relationship.

In other words, when one dot is formed by one discharge of the ink droplet, the dot interval D is a value (=v/f) which is obtained by dividing the speed v by the discharge frequency f of the ink, that is, the distance, by which the head unit 20 moves in a cycle (1/f) during which the ink droplets are repeatedly discharged.

In addition, in the examples of FIGS. 4A and 4B, the pitch Ph has a relationship proportional to the dot interval D by a coefficient n, and the ink droplets discharged from the two rows of the nozzles 651 land to be gathered in the same row on the printing medium P. For this reason, as illustrated in FIG. 4B, the dot interval in the auxiliary scanning direction is half of the dot interval in the main scanning direction. It is needless to say that the dot arrangement is not limited to the illustrated example.

However, in order to realize high speed printing, simply, the speed v at which the head unit 20 moves in the main scanning direction may be increased. However, simply by increasing the speed v, the dot interval D becomes longer. For this reason, in order to realize high speed printing after ensuring a certain level of resolution, it is necessary to increase the discharge frequency f of the ink, and to increase the number of formed dots per unit time.

In addition to the printing speed, in order to improve resolution, the number of formed dots per unit area may be increased. However, in a case where the number of dots is increased, when the amount of the ink is not small, the adjacent dots are combined with each other, and when the discharge frequency f of the ink is not increased, the printing speed deteriorates.

In this manner, in order to realize the high speed printing and the high resolution printing, it is necessary to increase the discharge frequency f of the ink as described above.

Meanwhile, as a method for forming the dots on the printing medium P, in addition to the method for forming one dot by discharging the ink droplet one time, a method (second method) for forming one dot by making it possible to discharge the ink droplets two or more times in a unit period, making one or more ink droplets discharged in the unit period land, and combining one or more landed ink droplets, or a method (third method) for forming two or more dots without combining two or more ink droplets, is employed. In the following description, a case where the dot is formed by the second method will be described.

In the embodiment, a second method will be described as an example as follows. In other words, in the embodiment, regarding one dot, by discharging the ink maximum two times, four gradations, such as a large dot, an intermediate dot, a small dot, and non-recording, are expressed. In order to express the four gradations, in the embodiment, two types of driving signals COM-A and COM-B are prepared, and each of the driving signals has a first-half pattern and a second-half pattern in one cycle. In one cycle, the driving signals COM-A and COM-B in the first-half pattern and the second-half pattern are selected corresponding to the gradation to be expressed (or not selected), and supplied to the piezoelectric element 60.

Here, the driving signals COM-A and COM-B will be described, and then, a configuration for selecting the driving signals COM-A and COM-B will be described. In addition, each of the driving signals COM-A and COM-B is generated by the driving circuit 50, but for convenience, the driving circuit 50 will be described after describing the configuration for selecting the driving signals COM-A and COM-B.

FIG. 5 is a view illustrating waveforms or the like of the driving signals COM-A and COM-B.

As illustrated in FIG. 5, the driving signal COM-A is a waveform in which a trapezoidal waveform Adp1 which is in a period T1 from the output (rising) of the control signal LAT to the output of the control signal CH in a cycle Ta, and a trapezoidal waveform Adp2 which is in a period T2 from the output of the control signal CH to the output of the following control signal LAT in the cycle Ta, are continuous.

The trapezoidal waveforms Adp1 and Adp2 in the embodiment have substantially the same shape as each other, and if each of the trapezoidal waveforms is supplied to one end of the piezoelectric element 60, each of the trapezoidal waveforms discharges a predetermined amount, specifically, an approximately intermediate amount of ink from the nozzle 651 corresponding to the piezoelectric element 60.

The driving signal COM-B is a waveform in which a trapezoidal waveform Bdp1 disposed in a period T1 and a trapezoidal waveform Bdp2 disposed in a period T2 are continuous. The trapezoidal waveforms Bdp1 and Bdp2 in the embodiment are waveforms different from each other. Among these, the trapezoidal waveform Bdp1 is a wave for preventing the viscosity of the ink from increasing by micro-vibrating the ink in the vicinity of the opening portion of the nozzle 651. For this reason, even if the trapezoidal waveform Bdp1 is supplied to one end of the piezoelectric element 60, the ink droplets are not discharged from the nozzle 651 corresponding to the piezoelectric element 60. In addition, the trapezoidal waveform Bdp2 is a waveform different from the trapezoidal waveform Adp1 (Adp2). If the trapezoidal waveform Bdp2 is supplied to one end of the piezoelectric element 60, the trapezoidal waveform Bdp2 discharges a smaller amount of ink than the predetermined amount from the nozzle 651 corresponding to the piezoelectric element 60.

In addition, any of a voltage at an initiation timing of the trapezoidal waveforms Adp1, Adp2, Bdp1, and Bdp2, and a voltage at a termination timing, is a common voltage Vc. In other words, each of the trapezoidal waveforms Adp1, Adp2, Bdp1, and Bdp2 is a waveform which is initiated at the voltage Vc and terminated at the voltage Vc.

FIG. 6 is a view illustrating a configuration of the selection control portion 210 in FIG. 2.

As illustrated in FIG. 6, the clock signal Sck, the data signal Data, and the control signals LAT and CH are supplied from the control unit 10 to the selection control portion 210. In the selection control portion 210, a group of a shift register (S/R) 212, a latch circuit 214, and a decoder 216 is provided corresponding to each of the piezoelectric elements 60 (nozzles 651).

When forming one dot of the image, the data signal Data regulates the size of the dot. In the embodiment, in order to express four gradations, such as non-recording, a small dot, an intermediate dot, and a large dot, the data signal Data is configured of 2 bits including a high-order bit (MSB) and a low-order bit (LSB).

The data signal Data is serially supplied from the control portion 100 in accordance with main scanning of the head unit 20 to each nozzle being synchronized with the clock signal Sck. A configuration for holding the data signal Data which is serially supplied by 2 bits corresponding to the nozzle is the shift register 212.

Specifically, the shift registers 212 in which the number of stages corresponds to the piezoelectric elements (nozzles) are continuously connected to each other, and the data signal Data which is serially supplied is transferred to the following stage in accordance with the clock signal Sck.

In addition, when the number of piezoelectric elements 60 is m (m is a plural number), in order to distinguish the shift registers 212, the stages are written as a first stage, a second stage, . . . , an m-th stage in order from an upstream side in which the data signal Data is supplied.

The latch circuit 214 latches the data signal Data held by the shift register 212 at the rise of the control signal LAT.

The decoder 216 decodes the 2-bit data signal Data which is latched by the latch circuit 214, outputs selected signals Sa and Sb in each of the periods T1 and T2 according to the regulation of the control signal LAT and the control signal CH, and regulates the selection by the selection portion 230.

FIG. 7 is a view illustrating decoding contents in the decoder 216.

In FIG. 7, the latched 2-bit data signal Data is written as (MSB, LSB). A case where the latched data signal Data is (0, 1), for example, means that the decoder 216 performs the output by setting each of logic levels of the selected signals Sa and Sb to be at the H and L levels in the period T1, and to be at L and H levels in the period T2.

In addition, the logic levels of the selected signals Sa and Sb are level-shifted to a high amplitude logic by a level shifter (not illustrated) from the logic levels of the clock signal Sck, the data signal Data, and the control signals LAT and CH.

Figure 8:
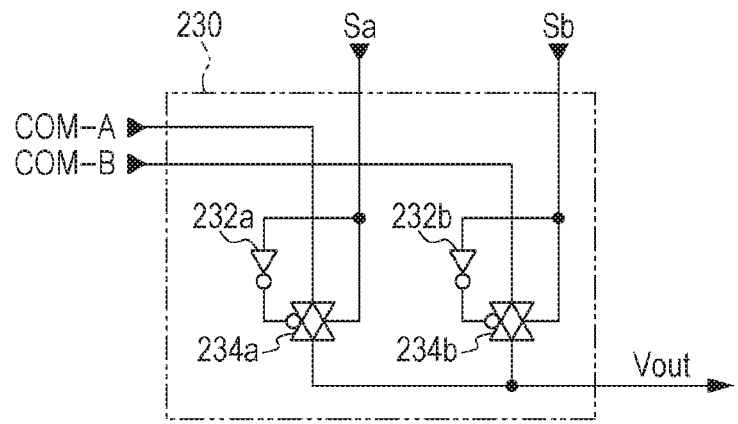
FIG. 8 is a view illustrating a configuration of a selection portion in the head unit.

FIG. 8 is a view illustrating a configuration of the selection portion 230 corresponding to one piezoelectric element 60 (nozzle 651) in FIG. 2.

As illustrated in FIG. 8, the selection portion 230 includes inverters (NOT circuits) 232a and 232b, and transfer gates 234a and 234b.

While the selected signal Sa from the decoder 216 is supplied to a positive control end to which the circle is not attached in the transfer gate 234a, the selected signal Sa is logic-inverted by the inverter 232a and supplied to a negative control end to which the circle is attached in the transfer gate 234a. Similarly, while the selected signal Sb is supplied to a positive control end of the transfer gate 234b, the selected signal Sb is logic-inverted by the inverter 232b and supplied to a negative control end of the transfer gate 234b.

The driving signal COM-A is supplied to an input end of the transfer gate 234a, and the driving signal COM-B is supplied to an input end of the transfer gate 234b. Both output ends of the transfer gates 234a and 234b are commonly connected to each other, and connected to one end of the corresponding piezoelectric element 60.

If the selected signal Sa is at the H level, the transfer gate 234a is conducted (ON) between the input end and the output end, and if the selected signal Sa is at the L level, the transfer gate 234a is non-conducted (OFF) between the input end and the output end. Similarly, the transfer gate 234b is turned ON and OFF between the input end and the output end corresponding to the selected signal Sb.

Next, operations of the selection control portion 210 and the selection portion 230 will be described with reference to FIG. 5.

The data signal Data is synchronized with the clock signal Sck and serially supplied in each nozzle from the control portion 100, and transferred in order in the shift register 212 corresponding to the nozzle. In addition, when the control portion 100 stops the supply of the clock signal Sck, the data signal Data which corresponds to the nozzle is held in each of the shift registers 212. In addition, the data signal Data is supplied in order which corresponds to the nozzles on the final m-th stage, . . . , the second stage, and the first stage in a shift register 222.

Here, when the control signal LAT rises, each of the latch circuits 214 simultaneously latches the data signal Data held in the shift register 212. In FIG. 5, L1, L2, . . . , Lm illustrate the data signal Data which is latched by the latch circuit 214 corresponding to the shift register 212 on the first stage, the second stage, . . . , the m-th stage.

The decoder 216 outputs the logic levels of the selected signals Sa and Sb as the contents illustrated in FIG. 7 in each of the periods T1 and T2 in accordance with the size of the dots regulated by the latched data signal Data.

In other words, firstly, when the data signal Data is (1, 1) and regulates the size of the large dot, the decoder 216 sets the selected signals Sa and Sb to the H and L levels in the period T1, and to the H and L levels even in the period T2. Secondly, when the data signal Data is (0, 1) and regulates the size of the intermediate dot, the decoder 216 sets the selected signals Sa and Sb to the H and L levels in the period T1, and to the L and H levels in the period T2. Thirdly, when the data signal Data is (1, 0) and regulates the size of the small dot, the decoder 216 sets the selected signals Sa and Sb to the L and L levels in the period T1, and to the L and H levels in the period T2. Fourthly, when the data signal Data is (0, 0) and regulates non-recording, the decoder 216 sets the selected signals Sa and Sb to the L and H levels in the period T1, and to the L and L levels in the period T2.

Figure 9:
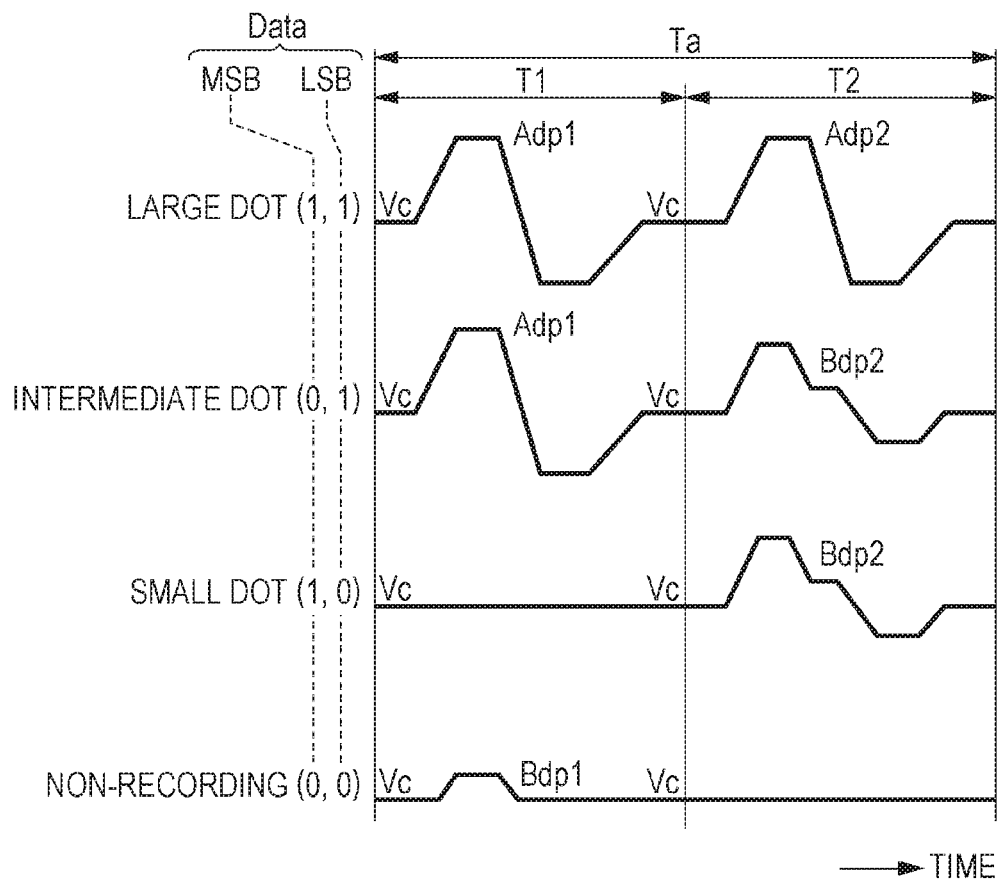
FIG. 9 is a view illustrating a driving signal selected by the selection portion.

FIG. 9 is a view illustrating a voltage waveform of the driving signal selected in accordance with the data signal Data and supplied to one end of the piezoelectric element 60.

When the data signal Data is (1, 1), since the selected signals Sa and Sb become the H and L levels in the period T1, the transfer gate 234a becomes ON and the transfer gate 234b becomes OFF. For this reason, the trapezoidal waveform Adp1 of the driving signal COM-A is selected in the period T1. Since the selected signals Sa and Sb become the H and L levels even in the period T2, the selection portion 230 selects the trapezoidal waveform Adp2 of the driving signal COM-A.

In this manner, when the trapezoidal waveform Adp1 is selected in the period T1, the trapezoidal waveform Adp2 is selected in the period T2, and the waveforms are supplied to one end of the piezoelectric element 60 as the driving signal, an approximately intermediate amount of ink is discharged being divided into 2 times from the nozzle 651 which corresponds to the piezoelectric element 60. For this reason, each drop of ink lands and is integrated as one drop on the printing medium P, and consequentially, the large dot according to the regulation of the data signal Data is formed.

When the data signal Data is (0, 1), since the selected signals Sa and Sb become the H and L levels in the period T1, the transfer gate 234a becomes ON and the transfer gate 234b becomes OFF. For this reason, the trapezoidal waveform Adp1 of the driving signal COM-A is selected in the period T1. Then, since the selected signals Sa and Sb become the L and H levels in the period T2, the trapezoidal waveform Bdp2 of the driving signal COM-B is selected.

Therefore, an intermediate amount and a small amount of ink are discharged being divided into 2 times from the nozzle. For this reason, each drop of ink lands and is integrated as one drop on the printing medium P, and consequentially, the intermediate dot according to the regulation of the data signal Data is formed.

When the data signal Data is (1, 0), since the selected signals Sa and Sb become the L level in the period T1, the transfer gates 234a and 234b become ON. For this reason, none of the trapezoidal waveforms Adp1 and Bdp1 is selected in the period T1. When both the transfer gates 234a and 234b are OFF, a route from a connection point between the output ends of the transfer gates 234a and 234b to one end of the piezoelectric element 60 becomes a high impedance state of not being electrically connected to any part. However, the piezoelectric element 60 holds a voltage (Vc-VBS) immediately before the transfer gates 234a and 234b become OFF due to capacitive characteristics thereof.

Next, since the selected signals Sa and Sb become the L and H levels in the period T2, the trapezoidal waveform Bdp2 of the driving signal COM-B is selected. For this reason, since an approximately small amount of ink is discharged from the nozzle 651 only in the period T2, the small dot according to the regulation of the data signal Data is formed on the printing medium P.

When the data signal Data is (0, 0), since the selected signals Sa and Sb become the L and H levels in the period T1, the transfer gate 234a becomes OFF and the transfer gate 234b becomes ON. For this reason, the trapezoidal waveform Bdp1 of the driving signal COM-B is selected in the period T1. Then, since both the selected signals Sa and Sb become the L level in the period T2, none of the trapezoidal waveforms Adp2 and Bdp2 is selected.

For this reason, since the ink in the vicinity of the opening portion of the nozzle 651 only micro-vibrates in the period T1 and the ink is not discharged, consequentially, the dot is not formed, that is, non-recording according to the regulation of the data signal Data is performed.

In this manner, the selection portion 230 selects (or does not select) the driving signals COM-A and COM-B following the instruction by the selection control portion 210, and supplies the driving signals to one end of the piezoelectric element 60. For this reason, each piezoelectric element 60 is driven in accordance with the size of the dots regulated by the data signal Data.

In addition, the driving signals COM-A and COM-B illustrated in FIG. 5 are merely examples. In reality, in accordance with a moving speed of the head unit 20 or properties of the printing medium P, combination of various waveforms prepared in advance is used.

In addition, here, the piezoelectric element 60 is described in an example in which the piezoelectric element 60 bends upwardly according to the rise of the voltage, but when the voltage supplied to the electrodes 611 and 612 is reversed, the piezoelectric element 60 bends downwardly according to the rise of the voltage. For this reason, in a configuration in which the piezoelectric element 60 bends downward according to the rise of the voltage, the driving signals COM-A and COM-B illustrated in FIG. 9 become waveforms reversed in accordance with the voltage Vc.

In this manner, in the embodiment, one dot is formed by considering the cycle Ta which is a unit period as a unit period on the printing medium P. For this reason, in the embodiment in which one dot is formed by (maximum) 2 times of the discharges of the ink droplets in the cycle Ta, the discharge frequency f of the ink becomes 2/Ta, and the dot interval D becomes a value which is obtained by dividing the speed v at which the head unit 20 moves by the discharge frequency f (=2/Ta) of the ink.

In general, when the ink droplets can be discharged Q (Q is an integer which is equal to or greater than 2) times in a unit period T and one dot is formed by Q times of the discharges of the ink droplets, the discharge frequency f of the ink can be expressed as Q/T.

As described in the embodiment, in a case where dots having different sizes are formed on the printing medium P, it is necessary to shorten the time for one time of discharge of the ink droplet even when the time (cycle) for forming one dot is the same, compared to a case where one dot is formed by one time of discharge of the ink droplet.

In addition, specific description of the third method for forming two or more dots without combining two or more ink droplets is not necessary.

2. Circuit Configuration of Capacitive Load Driving Circuit

Next, the driving circuits 50-*a* and 50-*b* will be described. Among these, when summarizing one driving circuit 50-*a*, the driving signal COM-A is generated as follows. In other words, firstly, the driving circuit 50-*a* analog-converts the data dA supplied from the control portion 100, secondly, the driving circuit 50-*a* sends back the driving signal COM-A of the output, corrects a deviation between a signal (attenuation signal) and a target signal based on the driving signal COM-A by the high frequency component of the driving signal COM-A, and generates the modulation signal according to the corrected signal, thirdly, the driving circuit 50-*a* generates an amplification modulation signal by switching the transistor according to the modulation signal, and fourthly, the driving circuit 50-*a* smoothes (demodulates) the amplification modulation signal by a low-pass filter, and outputs the smoothed signal as the driving signal COM-A.

The other driving circuit 50-*b* also has a similar configuration, and is different only in that the driving signal COM-B is output from the data dB. Here, in the following FIG. 10, a driving circuit 50 will be described without distinguishing the driving circuits 50-*a* and 50-*b*.

However, the input data and output driving signal are written as dA (dB) or COM-A (COM-B). The driving circuit 50-*a* illustrates that the data dA is input and the driving signal COM-A is output, and the driving circuit 50-*b* illustrates that the data dB is input and the driving signal COM-B is output.

Figure 10:
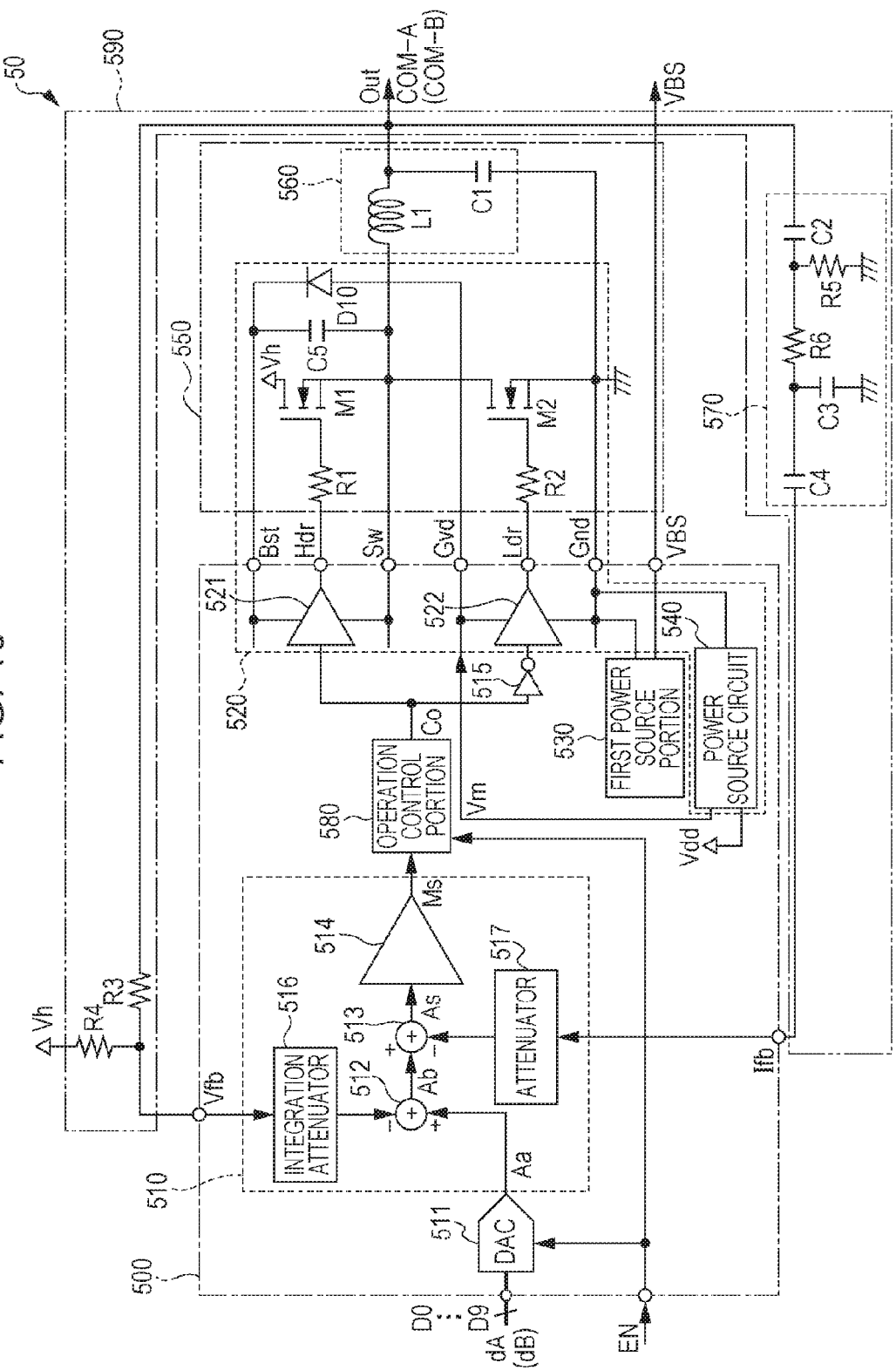
FIG. 10 is a view illustrating a circuit configuration of a driving circuit (capacitive load driving circuit).

FIG. 10 is a view illustrating a circuit configuration of the driving circuit (capacitive load driving circuit) 50. In addition, in FIG. 10, a configuration for outputting the driving signal COM-A is illustrated, but in reality, in an integrated circuit device 500, a circuit which generates both the driving signals COM-A and COM-B of two systems is in one package.

As illustrated in FIG. 10, the driving circuit 50 is configured of various elements, such as a resistor or a capacitor, in addition to the integrated circuit device 500 and an output circuit 550.

The driving circuit 50 in the embodiment includes a digital to analog converter (DAC) 511 (source signal generating portion) generating the source signal, a modulation portion 510 generating the modulation signal that is obtained by pulse-modulating the source signal, an amplifier 520, an operation control portion 580 controlling operations of the amplifier 520, a low-pass filter 560 generating the driving signal by demodulating the amplification modulation signal that is generated based on operations of a first transistor M1 (described below) and a second transistor M2 (described below), and a feedback circuit 590 generating a feedback signal based on the driving signal and sending back the feedback signal to the modulation portion 510.

The amplifier 520 is configured to include the first gate driver 521 generating the first amplification control signal based on the modulation signal, the second gate driver 522 generating the second amplification control signal based on the modulation signal, the first transistor M1 operating based on the first amplification control signal, the second transistor M2 connected to the first transistor M1 on a low-potential side in series and operating based on the second amplification control signal, a connection node electrically connecting the first transistor M1 and the second transistor M2, a capacitive element C5 electrically connected to the first gate driver 521 on a high-potential side, a rectifying element D10 provided between the second gate driver 522 on the high-potential side and the capacitive element C5, and a power source circuit 540 supplying power to the second gate driver 522 and supplying power to the capacitive element C5 via the rectifying element D10.

The integrated circuit device 500 in the embodiment includes the DAC 511 (source signal generating portion), the modulation portion 510, the operation control portion 580, an inverter 515 (described below), the first gate driver 521, the second gate driver 522, the power source circuit 540, and a first power source portion 530 (described below).

The integrated circuit device 500 outputs the first amplification control signal to the first transistor M1 and outputs the second amplification control signal to the second transistor M2 based on the digital data dA (source signal) of 10 bits input from the control portion 100 via terminals D0 to D9. For this reason, the integrated circuit device 500 includes the DAC 511 (source signal generating portion), the modulation portion 510, the first gate driver 521, the second gate driver 522, the first power source portion 530, and the power source circuit 540. The modulation portion 510 includes an adder 512, an adder 513, a comparator 514, an integration attenuator 516, and an attenuator 517.

The DAC 511 (source signal generating portion) converts the data dA which regulates the waveform of the driving signal COM-A into an analog signal Aa, and supplies the signal to an input end (+) of the adder 512. In addition, a voltage amplitude of the analog signal Aa is, for example, approximately 0 V to 2 V, and the voltage amplified approximately 20 times higher becomes the driving signal COM-A. In other words, the analog signal Aa is a signal to be a target before the amplification of the driving signal COM-A.

The integration attenuator 516 attenuates a voltage of a terminal Out input via the feedback circuit 590 and a feedback terminal Vfb, that is, the driving signal COM-A, integrates the voltage, and supplies the voltage to an input end (−) of the adder 512.

The adder 512 supplies a signal Ab of a voltage integrated by subtracting the voltage of the input end (−) from the voltage of the input end (+), to the input end (+) of the adder 513.

In addition, a power source voltage of a circuit which reaches the inverter 515 from the DAC 511 is 3.3 V (voltage Vdd) having a low amplitude. For this reason, while the voltage of the analog signal Aa is approximately maximum 2 V, there is a case where the voltage of the driving signal COM-A exceeds maximum 40 V. Therefore, in order to match amplitude ranges of both voltages when acquiring the deviation, the voltage of the driving signal COM-A is attenuated by the integration attenuator 516.

The attenuator 517 attenuates a high frequency component of the driving signal COM-A input via the feedback circuit 590 and a feedback terminal Ifb, and supplies the component to the input end (−) of the adder 513. The adder 513 supplies a signal As of the voltage which is obtained by subtracting the voltage of the input end (−) from the voltage of the input end (+) to the comparator 514. The attenuation by the attenuator 517 is for matching the amplitude when sending back the driving signal COM-A, similarly to the integration attenuator 516.

The voltage of the signal As output from the adder 513 is a voltage which is obtained by deducting the attenuated voltage of the signal supplied to the feedback terminal Vfb and subtracting the attenuated voltage of the signal supplied to the feedback terminal Ifb, from the voltage of the analog signal Aa. For this reason, the voltage of the signal As by the adder 513 can be a signal which is obtained by correcting a deviation obtained by deducting the attenuated voltage of the driving signal COM-A output from the terminal Out, from the voltage of the analog signal Aa which is a target, by the high frequency component of the driving signal COM-A.

The comparator 514 outputs a modulation signal Ms pulse-modulated as follows based on the voltage attenuated by the adder 513. Specifically, the comparator 514 outputs the modulation signal Ms which becomes the H level when the voltage becomes equal to or greater than a voltage threshold value Vth1 if the voltage of the signal As output from the adder 513 is rising, and becomes the L level when the voltage is lower than a voltage threshold value Vth2 level if the voltage of the signal As is lowering. In addition, as will be described later, the voltage threshold values are set to have a relationship of Vth1>Vth2.

The modulation signal Ms by the comparator 514 is supplied to the second gate driver 522 via the operation control portion 580 via logic inversion by the inverter 515. On the other hand, the modulation signal Ms is supplied to the first gate driver 521 via the operation control portion 580 without through the logic inversion. Thus, the logic levels supplied to the first gate driver 521 and the second gate driver 522 are exclusive to each other.

In reality, the timing of the logic levels supplied to the first gate driver 521 and the second gate driver 522 may be controlled so that both logic levels do not become the H level at the same time (so that the first transistor M1 and the second transistor M2 do not become ON at the same time). For this reason, strictly speaking, the exclusive relationship described here means that both logic levels do not become the H level at the same time (the first transistor M1 and the second transistor M2 do not become ON at the same time).

However, the modulation signal described here is the modulation signal Ms in a narrow sense, but when considering that the modulation signal is a signal pulse-modulated in accordance with the analog signal Aa, a negative signal of the modulation signal Ms is also included in the modulation signal. In other words, the modulation signal pulse-modulated in accordance with the analog signal Aa includes not only the modulation signal Ms, but also the signal in which the logic level of the modulation signal Ms is inverted or the signal in which the timing is controlled.

In addition, since the comparator 514 outputs the modulation signal Ms, the circuit which reaches the comparator 514, that is, the adder 512, the adder 513, the comparator 514, the integration attenuator 516, and the attenuator 517 correspond to the modulation portion 510 generating the modulation signal.

In addition, in the configuration illustrated in FIG. 10, the digital data dA is converted into the analog signal Aa by the DAC 511, but, for example, the analog signal Aa from an external circuit may be supplied following the instruction by the control portion 100, not via the DAC 511. In both cases of the data dA and the analog signal Aa, since the target value when generating the waveform of the driving signal COM-A is regulated, there is no change in that the signal is the source signal.

The first gate driver 521 level-shifts a low logic amplitude (L level: 0 V, H level: 3.3 V) which is an output signal of the comparator 514 to a high logic amplitude (for example, L level: 0 V and H level: 7.5 V), and outputs the high logic amplitude from a terminal Hdr. In the power source voltage of the first gate driver 521, a high-order side is a voltage applied via a terminal Bst, and a low-order side is a voltage applied via a terminal Sw. The terminal Sw is connected to a source electrode in the first transistor M1, a drain electrode in the second transistor M2, the other end of the capacitive element C5, and one end of an inductor L1.

The second gate driver 522 is operated on a side having a lower potential than that of the first gate driver 521. The second gate driver 522 level-shifts the low logic amplitude which is an output signal of the inverter 515 to the high logic amplitude and outputs the high logic amplitude from a terminal Ldr. In the power source voltage of the second gate driver 522, a voltage Vm (for example, 7.5 V) is applied as a high-order side, and a zero voltage is applied via a ground terminal Gnd as a low-order side. In other words, the ground terminal Gnd is grounded. In addition, the terminal Gvd is connected to an anode electrode of the rectifying element (diode) D10 for preventing a backflow and a cathode electrode of the rectifying element D10 is connected to one end of the capacitive element C5 and the terminal Bst. In addition, a configuration example of the second gate driver 522 will be later.

The first transistor M1 and the second transistor M2 are, for example, N channel type field effect transistors (FET) that are connected in series. Among these, in the high-side first transistor M1, a voltage Vh (for example, 42 V) is applied to the drain electrode, and a gate electrode is connected to the terminal Hdr via a resistor R1. In the low-side second transistor M2, a gate electrode is connected to the terminal Ldr via a resistor R2 and a source electrode is grounded.

The other end of the inductor L1 is the terminal Out which performs the output in the driving circuit 50 and the driving signal COM-A from the terminal Out is supplied to the head unit 20 via the flexible cable 190 (refer to FIGS. 1 and 2).

The terminal Out is connected to each of one end of a capacitor C1, one end of a capacitor C2, and one end of a resistor R3. Here, the other end of the capacitor C1 is grounded. For this reason, the inductor L1 and the capacitor C1 function as low-pass filters (LPF) which smooth the amplification modulation signal that appears at a connection point between the first transistor M1 and the second transistor M2.

The other end of the resistor R3 is connected to the feedback terminal Vfb and one end of a resistor R4, and the voltage Vh is applied to the other end of the resistor R4. Accordingly, the driving signal COM-A from the terminal Out is pulled up and sent back to the feedback terminal Vfb.

Meanwhile, the other end of the capacitor C2 is connected to one end of a resistor R5 and one end of a resistor R6.

Here, the other end of the resistor R5 is grounded. For this reason, the capacitor C2 and the resistor R5 function as high-pass filters which allow the high frequency component in which the frequency is equal to or higher than cutoff frequency to pass through, in the driving signal COM-A from the terminal Out. In addition, the cutoff frequency of the high-pass filter is set to approximately 9 MHz, for example.

In addition, the other end of the resistor R6 is connected to one end of a capacitor C4 and one end of a capacitor C3. Here, the other end of the capacitor C3 is grounded. For this reason, the resistor R6 and the capacitor C3 function as low-pass filters which allow a low frequency component in which the frequency is equal to or lower than the cutoff frequency to pass through, in a signal component that passes through the high-pass filter. In addition, the cutoff frequency of the LPF is set to approximately 160 MHz, for example.

Since the cutoff frequency of the high-pass filter is set to be lower than the cutoff frequency of the low-pass filter, the high-pass filter and the low-pass filter function as a band pass filter 570 which allows the high frequency component within a range of a predetermined frequency to pass through, in the driving signal COM-A.

The other end of the capacitor C4 is connected to the feedback terminal Ifb of the integrated circuit device 500. Accordingly, among the high frequency components of the driving signal COM-A which pass through the band pass filter 570, a DC component is cut and sent back to the feedback terminal Ifb.

However, the driving signal COM-A output from the terminal Out is a signal which smoothes the amplification modulation signal at the connection point (terminal Sw) between the first transistor M1 and the second transistor M2 by using the low-pass filter configured of the inductor L1 and the capacitor C1. Since the driving signal COM-A is positively sent back to the adder 512 after being integrated and subtracted via the feedback terminal Vfb, the feedback is delayed (a sum of a delay due to smoothing of the inductor L1 and the capacitor C1, and a delay due to the integration attenuator 516), and self-excited oscillation is performed at the frequency determined by a feedback transfer function.

However, since the amount of delay of a feedback path via the feedback terminal Vfb is large, there is a case where it is not possible to increase the frequency of the self-excited oscillation to be high enough to make it possible to ensure sufficient accuracy of the driving signal COM-A only by the feedback via the feedback terminal Vfb.

Here, in the embodiment, by providing a path for sending back the high frequency component of the driving signal COM-A via the feedback terminal Ifb in addition to the path via the feedback terminal Vfb, the delay in the entire circuit is reduced. In other words, in the embodiment, the feedback circuit 590 sends back the signal in the high frequency band of the driving signal as a feedback signal. For this reason, the frequency of the signal As which is obtained by adding the high frequency component of the driving signal COM-A to the signal Ab becomes high enough to make it possible to ensure sufficient accuracy of the driving signal COM-A, compared to a case where the path via the feedback terminal Ifb is not provided.

Figure 11:
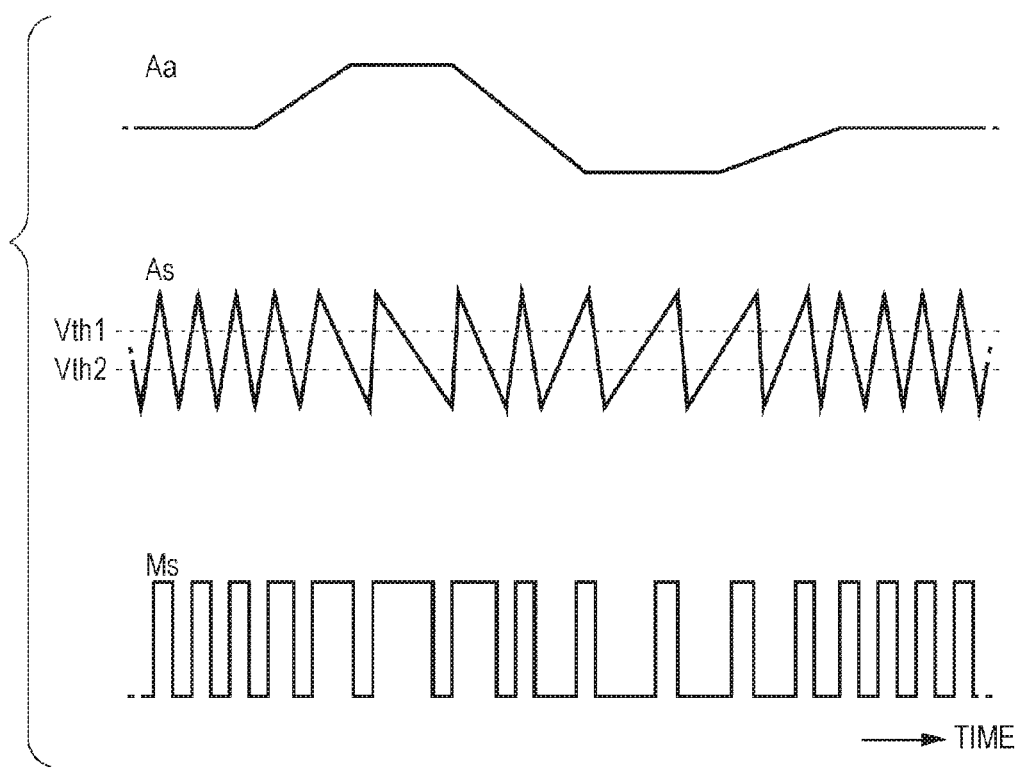
FIG. 11 is a view illustrating an operation of the driving circuit.

FIG. 11 is a view illustrating waveforms of the signal As and the modulation signal Ms in association with a waveform of the analog signal Aa.

As illustrated in FIG. 11, the signal As is a triangular waveform and the oscillation frequency thereof changes in accordance with the voltage (input voltage) of the analog signal Aa. Specifically, the oscillation frequency becomes the highest when the input voltage is an intermediate value and decreases as the input voltage increases or decreases from the intermediate value.

In addition, when the input voltage is close to the intermediate value, an inclination of the triangular waveform in the signal As becomes substantially equivalent on upward (increasing of the voltage) and downward (decreasing of the voltage) inclination. For this reason, a duty ratio of the modulation signal Ms which is a result of comparison of the signal As with the voltage threshold values Vth1 and Vth2 by the comparator 514 is substantially 50%. When the input voltage increases from the intermediate value, the downward inclination of the signal As becomes gentle. For this reason, the period during which the modulation signal Ms becomes the H level becomes relatively longer and the duty ratio becomes larger. Meanwhile, as the input voltage decreases from the intermediate value, the upward inclination of the signal As becomes gentle. For this reason, the period during which the modulation signal Ms becomes the H level becomes relatively shorter and the duty ratio becomes smaller.

For this reason, the modulation signal Ms becomes a pulse density modulation signal as follows. In other words, the duty ratio of the modulation signal Ms is substantially 50% when the input voltage is the intermediate value, increases as the input voltage becomes higher than the intermediate value, and decreases as the input voltage becomes lower than the intermediate value.

The first gate driver 521 makes the first transistor M1 ON/OFF based on the modulation signal Ms. In other words, the first gate driver 521 makes the first transistor M1 ON when the modulation signal Ms is the H level, and makes the first transistor M1 OFF when the modulation signal Ms is the L level. The second gate driver 522 makes the second transistor M2 ON/OFF based on a logic inversion signal of the modulation signal Ms. In other words, the second gate driver 522 makes the second transistor M2 OFF when the modulation signal Ms is the H level, and makes the second transistor M2 ON when the modulation signal Ms is the L level.

Therefore, since the voltage of the driving signal COM-A which is obtained by smoothing the amplification modulation signal by the inductor L1 and the capacitor C1 at the connection point between the first transistor M1 and the second transistor M2 becomes higher as the duty ratio of the modulation signal Ms becomes larger, and becomes lower as the duty ratio becomes smaller, consequentially, the driving signal COM-A is controlled to be a signal obtained by enlarging the voltage of the analog signal Aa, and output.

Since the driving circuit 50 uses the pulse density modulation, the driving circuit 50 has an advantage that a variation width of the duty ratio becomes larger compared to pulse width modulation in which the modulation frequency is fixed.

In other words, since the minimum positive pulse width and negative pulse width which can be handled in the entire circuit are restricted by characteristics of the circuit, only a predetermined range (for example, a range of 10% to 90%) can be ensured as the variation width of the duty ratio in the pulse width modulation in which the frequency is fixed. In contrast to this, since the oscillation frequency decreases as the input voltage is separated from the intermediate value in the pulse density modulation, it is possible to increase the duty ratio much higher in a region where the input voltage is high, and to reduce the duty ratio much lower in a region where the input voltage is low. For this reason, in the self-excited oscillation type pulse density modulation, it is possible to ensure a much wider range (for example, a range of 5% to 95%) as the variation range of the duty ratio.

In addition, the driving circuit 50 performs the self-excited oscillation, and a circuit which generates a carrier wave of high frequency is not necessary, unlike separately-excited oscillation. For this reason, there is an advantage that it is easy to perform integration at a part except for the circuit which handles the high frequency, that is, a part of the integrated circuit device 500.

Additionally, in the driving circuit 50, since not only the path via the feedback terminal Vfb, but also the path which sends back the high frequency component via the feedback terminal Ifb is provided as a feedback path of the driving signal COM-A, the delay in the entire circuit becomes smaller. For this reason, since the frequency of the self-excited oscillation becomes higher, the driving circuit 50 can generate the driving signal COM-A with high accuracy.

In the embodiment, the oscillation frequency of the modulation signal may be 1 MHz to 8 MHz.

In the above-described liquid discharging apparatus 1, the driving signal is generated by smoothing the amplification modulation signal, the piezoelectric element 60 is displaced as the driving signal is applied, and liquid is discharged from the nozzle 651. Here, when the liquid discharging apparatus 1 performs frequency spectrum analysis with respect to the waveform of the driving signal for discharging small dots, it is confirmed that the frequency component which is equal to or greater than 50 kHz is included. In order to generate the driving signal which includes the frequency component which is equal to or greater than 50 kHz, the frequency of the modulation signal (frequency of the self-excited oscillation) is required to be equal to or greater than 1 MHz.

If the frequency is lower than 1 MHz, an edge of the waveform of the reproduced driving signal is blunt and round. In other words, an angle is rounded and the waveform becomes blunt. When the waveform of the driving signal is blunt, the displacement of the piezoelectric element 60 which is operated in accordance with the rising or falling edge of the waveform becomes slow, tailing during discharge or a discharge defect is generated, and the quality of printing deteriorates.

Meanwhile, if the frequency of the self-excited oscillation is higher than 8 MHz, resolution of the waveform of the driving signal increases. However, as switching frequency increases in the transistor, switching loss increases, and compared to linear amplification of a class-AB amplifier or the like, excellent power saving performance and generated heat saving performance are deteriorated.

For this reason, in the above-described liquid discharging apparatus 1, in the head unit 20, the integrated circuit device 500, and the driving circuit 50, it is preferable that the frequency of the modulation signal is 1 MHz to 8 MHz.

Returning to FIG. 10, in the example illustrated in FIG. 10, the resistor R1, the resistor R2, the first transistor M1, the second transistor M2, the capacitive element C5, the rectifying element D10, and the low-pass filter 560 are configured as the output circuit 550 which generates the amplification control signal based on the modulation signal, generates the driving signal based on the amplification control signal, and outputs the driving signal to a capacitive load (piezoelectric element 60) based on amplification control signal.

The first power source portion 530 applies the signal to a terminal different from a terminal to which the driving signal of the piezoelectric element 60 is applied. The first power source portion 530 is configured of a constant voltage circuit, such as a band gap reference circuit. The first power source portion 530 outputs the voltage VBS from a terminal VBS. In the example illustrated in FIG. 10, the first power source portion 530 generates the voltage VBS by using a ground potential of the ground terminal Gnd as a reference.

The power source circuit 540 supplies power to the second gate driver 522 and supplies power to the capacitive element C5 via the rectifying element D10. The power source circuit 540 can be configured of a charge pump circuit or a switching regulator. In the example illustrated in FIG. 10, the power source circuit 540 generates the voltage Vm which becomes the power source voltage on the high-potential side of the second gate driver 522. In addition, the power source circuit 540 boosts the voltage Vdd by using the ground potential of the ground terminal Gnd as a reference, and generates the voltage Vm.

In the embodiment, the second gate driver 522, the first power source portion 530, and the power source circuit 540 are connected to the common ground terminal Gnd. In addition, the second gate driver 522, the first power source portion 530, and the power source circuit 540 may be connected to the ground terminals which are separated from each other.

In the embodiment, the power source circuit 540 may be the charge pump circuit. According to the embodiment, compared to a case where a switching regulator circuit is used as the power source circuit 540, it is possible to suppress generation of noise. Therefore, since it is possible to control the voltage applied to the piezoelectric element 60 with high accuracy, it is possible to realize the liquid discharging apparatus 1, the head unit 20, the integrated circuit device 500, and the driving circuit 50, in which the discharge accuracy of liquid can be improved.

The operation control portion 580 controls operations of the amplifier 520 based on the enable signal EN. In addition, the control portion 100 (see FIG. 2) may be responsible for a part or all functions of the operation control portion 580.

The operation control portion 580 performs a normal operation process which outputs the modulation signal Ms from the comparator 514 as an output signal Co to the following first gate driver 521 and the inverter 515 by allowing the modulation signal Ms to pass therethrough. In addition, the operation control portion 580 performs a stopping process that outputs the output signal Co which performs a control for stopping the operation of the amplifier 520 by allowing the first transistor M1 to be in the non-conductive state in which the current does not flow therethrough and the second transistor M2 to be in the conductive state in which the current flows therethrough. As described above, since the first transistor M1 and the second transistor M2 are the N channel type FET, a case where the voltage applied to the gate terminal is less than the threshold value voltage becomes the non-conductive state and a case where the voltage is equal to or greater than the threshold value voltage becomes the conductive state.

According to the embodiment, one end of the capacitive element C5 becomes the low potential by allowing the first transistor M1 to be in the non-conductive state and the second transistor M2 to be in the conductive state. Thus, it is possible to charge the capacitive element C5 via the rectifying element D10 during the stopping process. Thus, since it is possible to prevent the over-current from flowing through the circuit elements (rectifying element D10 and the second transistor M2) during starting the operation, it is possible to realize the liquid discharging apparatus 1, the head unit 20, and the driving circuit 50 having high reliability.

The operation control portion 580 may perform the stopping process described above after performing the lowering process for lowering the voltage of the driving signal.

Figure 12A:
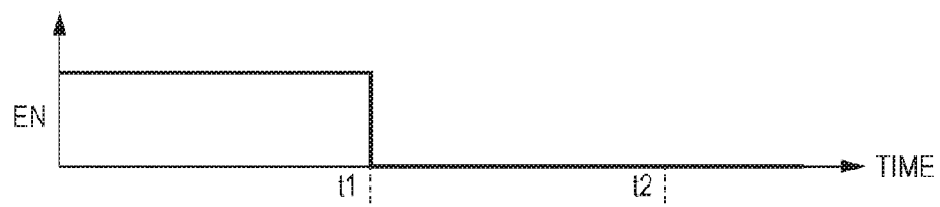
FIGS. 12A to 12C are timing charts illustrating an operation of an operation control portion.
Figure 12B:
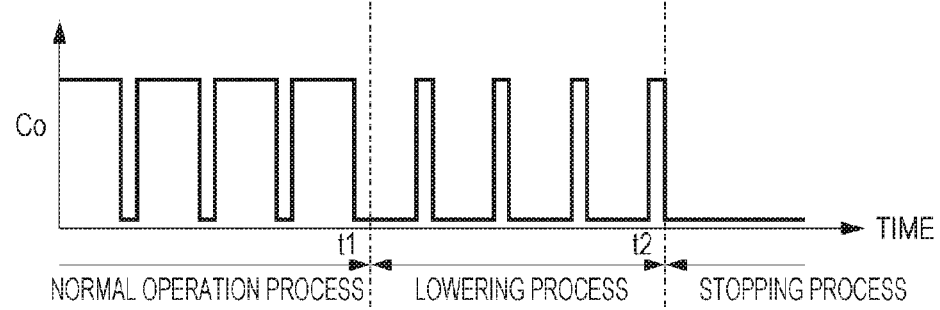
Figure 12C:
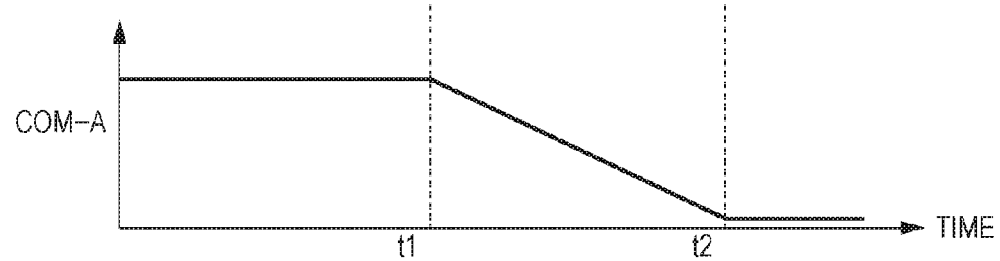

FIGS. 12A to 12C are timing charts illustrating the operation of the operation control portion 580. FIG. 12A is a timing chart of the enable signal EN, FIG. 12B is a time chart of the output signal Co of the operation control portion 580, and FIG. 12C is a time chart of the driving signal COM-A. A horizontal axis represents the time and a vertical axis represents the voltage in FIGS. 12A to 12C.

In the example illustrated in FIGS. 12A to 12C, in the enable signal EN, a period to a time t1 becomes a high level and a period following the time t1 becomes a low level. In this case, the operation control portion 580 performs the normal operation process in the period to the time t1, performs the lowering process in a period from the time t1 to the time t2, and performs the stopping process in a period following the time t2.

For example, if the duty ratio of the modulation signal Ms is in a range between 5% and 95%, the operation control portion 580 outputs a predetermined number of pulses (4 pulses in the example illustrated in FIG. 12B) as the output signal Co by allowing the duty ratio of the modulation signal Ms to be 5%. As illustrated in FIG. 12C, the voltage of the driving signal COM-A is lowered by performing the lowering process from the time t1 to the time t2.

According to the embodiment, when the second transistor M2 is in the conductive state, it is possible to reduce the resonance amplitude even if the resonant loop is formed via the resistance component of the second transistor M2, the inductor L1 and the capacitor C1 of the low-pass filter 560, and the ground line. Thus, since it is possible to prevent the over-current from flowing through the second transistor M2, it is possible to realize the liquid discharging apparatus 1, the head unit 20, and the driving circuit 50 having high reliability.

The operation control portion 580 may perform control of the voltage of the driving signal COM-A to be a lowest value of the output range of the driving signal corresponding to the input range of the source signal in the lowering process. More particularly, in the lowering process, the operation control portion 580 may control the driving signal COM-A by controlling the output of the DAC 511 (source signal generating portion) to be the lowest value or the maximum value. That is, in this case, the DAC 511 (source signal generating portion) ignores the input of the data dA and outputs the lowest value or the maximum value as the source signal (analog signal Aa). Control to the DAC 511 (source signal generating portion) may be performed by the operation control portion 580 or may be performed by the control portion 100 via the enable signal EN.

According to the embodiment, also in the lowering process, since the driving signal is continuously generated based on the source signal, it is possible to reduce a possibility that an oscillation loop is formed via the resistance component of the second transistor M2, the inductor L1 and the capacitor C1 of the low-pass filter 560, and the ground line. Thus, it is possible to prevent the over-current from flowing through the second transistor M2 and thereby it is possible to realize the liquid discharging apparatus 1, the head unit 20, and the driving circuit 50 having high reliability.

If the voltage of the driving signal COM-A is constant, the operation control portion 580 may perform the pausing process that pauses the operation of the amplifier 520 by allowing the first transistor M1 and the second transistor M2 to be in the non-conductive state in which the current does not flow therethough.

Since the piezoelectric element 60 has a nature for holding the voltage, according to the embodiment, it is possible to reduce power consumption in the amplifier 520 and the low-pass filter 560 by performing the pausing process if the voltage of the driving signal COM-A is constant.

3. Control Method of Capacitive Load Driving Circuit

FIG. 13 is a flowchart illustrating a control method of the capacitive load driving circuit according to the embodiment. In the following description, a case where the method is realized by using the above-described driving circuit 50 (capacitive load driving circuit) is described as an example.

The control method of the capacitive load driving circuit according to the embodiment includes a step of performing the lowering process for lowering the voltage of the driving signal COM-A and a step of performing the stopping process for stopping the operation of the amplifier 520 by allowing the first transistor M1 to be in the non-conductive state in which the current does not flow through the first transistor M1 and the second transistor M2 to be in the conductive state in which the current flows through the second transistor M2.

More particularly, firstly, the lowering process for lowering the voltage of the driving signal COM-A is performed (step S100). In the embodiment, the control portion 100 performs the lowering process. Details of the lowering process are described in the portion of "2. Circuit Configuration of Capacitive Load Driving Circuit".

After step S100, the stopping process for stopping the operation of the amplifier 520 is performed by allowing the first transistor M1 to be in the non-conductive state and the second transistor M2 to be in the conductive state. In the embodiment, the operation control portion 580 performs the stopping process. Details of the stopping process are described in the portion of "2. Circuit Configuration of Capacitive Load Driving Circuit".

According to the embodiment, one end of the capacitive element C5 becomes the low potential by allowing the first transistor M1 to be in the non-conductive state and the second transistor M2 to be in the conductive state. Thus, it is possible to charge the capacitive element C5 via the rectifying element D10 during the stopping process. Thus, since it is possible to prevent the over-current from flowing through the circuit elements (rectifying element D10 and the second transistor M2) during starting the operation, it is possible to realize the control method of the capacitive load driving circuit having high reliability.

Above, the embodiment and modification examples are described, but the invention is not limited to the embodiment and the modification examples, and can be carried out in various aspects without departing the range of the main idea.

The invention includes a configuration (for example, a configuration which has the same functions, methods, and effects, or a configuration which has the same purpose and effects) which is substantially the same as the configuration described in the embodiment. In addition, the invention includes a configuration in which a part which is not essential in the configuration described in the embodiment is replaced. In addition, the invention includes a configuration which achieves the same operation effects, and a configuration which can achieve the same purpose, as those of the configuration described in the embodiment. In addition, the invention includes a configuration in which a known technology is added to the configuration described in the embodiment.

What is claimed is:

1. A liquid discharging apparatus comprising:
a modulation portion that generates a modulation signal obtained by pulse-modulating a source signal;
an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element;
an operation control portion that controls operations of the amplifier based on the modulation signal;
a low-pass filter that generates a driving signal by demodulating an amplification modulation signal generated based on operations of the first transistor and the second transistor;
a piezoelectric element that is displaced by applying the driving signal;
a cavity of which an inside is filled with a liquid and an internal volume is changed by displacement of the piezoelectric element; and
a nozzle that communicates with the cavity and discharges the liquid on the inside of the cavity as liquid droplets in accordance with the change in the internal volume of the cavity,
wherein the liquid discharging apparatus operates in a normal operation process and in a stopping operation process, and in the stopping operation process the operation control portion performs a stopping process that stops an operation of the amplifier by allowing the first transistor to be in a non-conductive state in which a current does not flow through the first transistor and the second transistor to be in a conductive state in which the current flows through the second transistor.

2. The liquid discharging apparatus according to claim 1, wherein the operation control portion performs the stopping process after a lowering process for lowering a voltage of the driving signal.

3. The liquid discharging apparatus according to claim 2, wherein the operation control portion performs control of the voltage of the driving signal to be a lowest value of an output range of the driving signal corresponding to an input range of the source signal in the lowering process.

4. The liquid discharging apparatus according to claim 3, further comprising:
a source signal generating portion that generates the source signal, and
a feedback circuit that generates a feedback signal based on the driving signal and sends back the feedback signal to the modulation portion,
wherein the operation control portion controls the driving signal by controlling an output of the source signal generating portion to be the lowest value or a maximum value in the lowering process.

5. The liquid discharging apparatus according to claim 1, wherein the operation control portion performs a pausing process that pauses the operation of the amplifier by allowing the first transistor and the second transistor to be in the non-conductive state in which the current does not flow therethrough if the voltage of the driving signal is constant.

6. The liquid discharging apparatus according to claim 1, wherein an oscillation frequency of the modulation signal is equal to or greater than 1 MHz and equal to or less than 8 MHz.

7. A head unit comprising:
a modulation portion that generates a modulation signal obtained by pulse-modulating a source signal;
an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element;
an operation control portion that controls operations of the amplifier based on the modulation signal;
a low-pass filter that generates a driving signal by demodulating an amplification modulation signal generated based on operations of the first transistor and the second transistor;
a piezoelectric element that is displaced by applying the driving signal;
a cavity of which an inside is filled with a liquid and an internal volume is changed by displacement of the piezoelectric element; and
a nozzle that communicates with the cavity and discharges the liquid on the inside of the cavity as liquid droplets in accordance with the change in the internal volume of the cavity,
wherein the head unit operates in a normal operation process and in a stopping operation process, and in the stopping operation process the operation control portion performs a stopping process that stops an operation of the amplifier by allowing the first transistor to be in a non-conductive state in which a current does not flow through the first transistor and the second transistor to be in a conductive state in which the current flows through the second transistor.

8. A capacitive load driving circuit comprising:
a modulation portion that generates a modulation signal obtained by pulse-modulating a source signal;
an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element;

an operation control portion that controls operations of the amplifier based on the modulation signal; and a low-pass filter that generates a driving signal by demodulating an amplification modulation signal generated based on operations of the first transistor and the second transistor, and outputs the driving signal to a capacitive load, wherein the capacitive load driving circuit operates in a normal operation process and in a stopping operation process, and in the stopping operation process the operation control portion performs a stopping process that stops an operation of the amplifier by allowing the first transistor to be in a non-conductive state in which a current does not flow through the first transistor and the second transistor to be in a conductive state in which the current flows through the second transistor.

9. A control method of a capacitive load driving circuit, the capacitive load driving circuit including:

a modulation portion that generates a modulation signal obtained by pulse-modulating a source signal;

an amplifier that includes a first gate driver generating a first amplification control signal based on the modulation signal, a second gate driver generating a second amplification control signal based on the modulation signal, a first transistor operating based on the first amplification control signal, a second transistor connected to the first transistor on a low-potential side in series and operating based on the second amplification control signal, a connection node electrically connecting the first transistor and the second transistor, a capacitive element electrically connected to the first gate driver on a high-potential side, a rectifying element provided between the second gate driver on the high-potential side and the capacitive element, and a power source circuit supplying power to the second gate driver and supplying power to the capacitive element via the rectifying element;

an operation control portion that controls operations of the amplifier based on the modulation signal; and a low-pass filter that generates a driving signal by demodulating an amplification modulation signal generated based on operations of the first transistor and the second transistor, and outputs the driving signal to a capacitive load, wherein the capacitive load driving circuit operates in a normal operation process and in a stopping operation process, the method comprising:

performing a lowering process for lowering a voltage of the driving signal; and in the stopping operation process, performing a stopping process for stopping an operation of the amplifier by allowing the first transistor to be in a non-conductive state in which the current does not flow through the first transistor and the second transistor to be in a conductive state in which the cut flows through the second transistor.

* * * * *